US010424759B2

(12) United States Patent
Jang (10) Patent No.: US 10,424,759 B2
(45) Date of Patent: Sep. 24, 2019

(54) METHOD OF MANUFACTURING AN ORGANIC LIGHT-EMITTING DISPLAY

(71) Applicant: Samsung Display Co., Ltd., Yongin-si (KR)

(72) Inventor: Joo-Nyung Jang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/866,365

(22) Filed: Jan. 9, 2018

(65) Prior Publication Data

US 2018/0159073 A1 Jun. 7, 2018

Related U.S. Application Data

(62) Division of application No. 14/605,628, filed on Jan. 26, 2015, now Pat. No. 9,905,798.

(30) Foreign Application Priority Data

May 23, 2014 (KR) ........................ 10-2014-0062609

(51) Int. Cl.
*H01L 51/52* (2006.01)
*H01L 51/56* (2006.01)
*H01L 27/32* (2006.01)

(52) U.S. Cl.
CPC ...... *H01L 51/5246* (2013.01); *H01L 27/3246* (2013.01); *H01L 27/3258* (2013.01);
(Continued)

(58) Field of Classification Search
CPC ............. H01L 27/3248; H01L 27/3258; H01L 27/3276; H01L 51/52; H01L 51/56
See application file for complete search history.

(56) References Cited

U.S. PATENT DOCUMENTS 8,253,328 B2 8/2012 Hayashi
2003/0230749 A1* 12/2003 Isobe .................. B23K 26/032
257/59
(Continued)

FOREIGN PATENT DOCUMENTS

JP 07-102982 11/1995
JP 2010-027561 2/2010
(Continued)

OTHER PUBLICATIONS

Jiang, Q., et al., "Thermal stability of crystalline thin films," Thin Solid Films, Jan. 14, 1993, pp. 357-361, vol. 312, Issue 1-2, Elsevier Science S.A.
(Continued)

*Primary Examiner* — Tracie Y Green
(74) *Attorney, Agent, or Firm* — H.C. Park & Associates, PLC (57) ABSTRACT

A method of manufacturing an organic light-emitting display apparatus includes preparing a lower substrate comprising a display area and a peripheral area surrounding the display area. A first thin film transistors (TFTs) is formed in the display area of the lower substrate. A first insulating layer is formed and disposed in the display area and at least a portion of the peripheral area of the lower substrate and that covers the first TFTs. Organic light-emitting diodes (OLEDs) are formed to be electrically connected to the first TFTs. A barrier layer is formed on at least a portion of the first insulating layer that is formed in the peripheral area of the lower substrate. A sealant is formed on the barrier layer such that at least a portion of the sealant overlaps the first insulating layer, and an upper substrate is sealed with the lower substrate.

15 Claims, 6 Drawing Sheets

(52) U.S. Cl.
CPC ........ *H01L 27/3276* (2013.01); *H01L 51/529* (2013.01); *H01L 51/56* (2013.01); *H01L 51/5253* (2013.01)

(56) References Cited

U.S. PATENT DOCUMENTS

| | | |
|---|---|---|
| 2005/0062409 A1 | 3/2005 | Yamazaki et al. |
| 2007/0170846 A1* | 7/2007 | Choi .................. H01L 51/5246 313/504 |
| 2007/0222382 A1* | 9/2007 | Yamazaki ........... H01L 51/5246 313/512 |
| 2009/0058293 A1* | 3/2009 | Maeda ................ H01L 27/3276 313/512 |
| 2011/0095290 A1 | 4/2011 | Koo et al. |
| 2011/0140373 A1 | 6/2011 | Lee et al. |
| 2011/0263059 A1 | 10/2011 | Takayama et al. |
| 2011/0272715 A1 | 11/2011 | Kang et al. |
| 2013/0049003 A1 | 2/2013 | Choi et al. |
| 2014/0117336 A1 | 5/2014 | Kim et al. |
| 2014/0138668 A1 | 5/2014 | You et al. |

FOREIGN PATENT DOCUMENTS

| | | |
|---|---|---|
| KR | 10-0659763 | 12/2006 |
| KR | 10-2011-0119428 | 11/2011 |
| KR | 10-2012-0077470 | 7/2012 |

OTHER PUBLICATIONS

Q. Jiang, et al., "Melting thermodynamics of organic nanocrystals," Journal of Chemical Physics, Aug. 1, 1999, pp. 2176-2180, vol. 111, No. 5, American Institute of Physics, Melville, New York.
Non Final Office Action dated Feb. 12, 2016, in U.S. Appl. No. 14/605,628.
Final Office Action dated Aug. 17, 2016, in U.S. Appl. No. 14/605,628.
Non Final Office Action dated Nov. 21, 2016, in U.S. Appl. No. 14/605,628.
Final Office Action dated Jun. 2, 2017, in U.S. Appl. No. 14/605,628.
Notice of Allowance dated Oct. 6, 2017, in U.S. Appl. No. 14/605,628.
Corrected Notice of Allowance dated Oct. 18, 2017, in U.S. Appl. No. 14/605,628.

* cited by examiner

METHOD OF MANUFACTURING AN ORGANIC LIGHT-EMITTING DISPLAY

RELATED APPLICATION

This application is a Divisional of U.S. patent application Ser. No. 14/605,628, filed on Jan. 26, 2015, now issued as U.S. Pat. No. 9,905,798, and claims priority from and the benefit of Korean Patent Application No. 10-2014-0062609, filed on May 23, 2014, each of which is hereby incorporated by reference for all purpose as if fully set forth herein.

BACKGROUND

Field

One or more embodiments of the present invention relate to an organic light-emitting display apparatus and a method of manufacturing the same, and more particularly, to an organic light-emitting display apparatus including a reduced dead space and a method of manufacturing the same.

Discussion of the Background

Among display apparatuses, organic light-emitting display apparatuses are regarded as the next-generation display apparatuses due to their excellent features, such as a wide viewing angle, a high contrast ratio, and a quick response time.

In general, the organic light-emitting display apparatuses are manufactured by forming organic light-emitting diodes (OLEDs) on a lower substrate. An upper substrate and the lower substrate are attached such that the OLEDs are located therebetween. The organic light-emitting display apparatuses are used as display units in small devices, such as cellular phones, or in large devices, such as TVs.

In the organic light-emitting display apparatuses, a sealant is used to attach the upper and lower substrates.

However, in the related art, organic light-emitting display apparatuses and methods of manufacturing the same have problems since an area without an emission unit, i.e., a dead space, is created in a region where a sealant is provided, and the dead space prevents a display region from being expanded toward the edges of the apparatus.

SUMMARY

One or more embodiments of the present invention include an organic light-emitting display apparatus including a reduced dead space, and a method of manufacturing the same.

Additional aspects will be set forth in part in the description which follows and, in part, will be apparent from the description, or may be learned by practice of the presented embodiments.

According to one or more embodiments of the present invention, an organic light-emitting display apparatus includes a lower substrate including a display area and a peripheral area surrounding the display area; first thin film transistors (TFTs) disposed in the display area of the lower substrate; a first insulating layer that is disposed in the display area and at least a portion of the peripheral area of the lower substrate and covers the first TFTs; organic light-emitting diodes (OLEDs) electrically connected to the first TFTs; a sealant disposed such that at least a portion of the sealant overlaps the first insulating layer; a barrier layer provided between the first insulating layer and the sealant; and an upper substrate corresponding to the lower substrate.

According to one or more embodiments of the present invention, a method of manufacturing an organic light-emitting display apparatus includes preparing a lower substrate including a display area and a peripheral area surrounding the display area; forming first thin film transistors (TFTs) in the display area of the lower substrate; forming a first insulating layer that covers the first TFTs, in the display area and at least a portion of the peripheral area of the lower substrate; forming organic light-emitting diodes (OLEDs) to be electrically connected to the first TFTs; forming a barrier layer on at least a portion of the first insulating layer that is formed in an area that corresponds to the peripheral area of the lower substrate; forming a sealant on the barrier layer such that at least a portion of the sealant overlaps on the first insulating layer; and sealing an upper substrate to face the lower substrate.

These general and specific embodiments may be implemented by using a system, a method, a computer program, or a combination of the system, the method, and the computer program.

The above information disclosed in this Background section is only for enhancement of understanding of the background of the inventive concept, and, therefore, it may contain information that does constitute prior art.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

When certain embodiments may be implemented differently, a specific process order may be performed differently from the described order. For example, two consecutively described processes may be performed substantially at the same time or performed in an order opposite to the described order.

Figure 1:
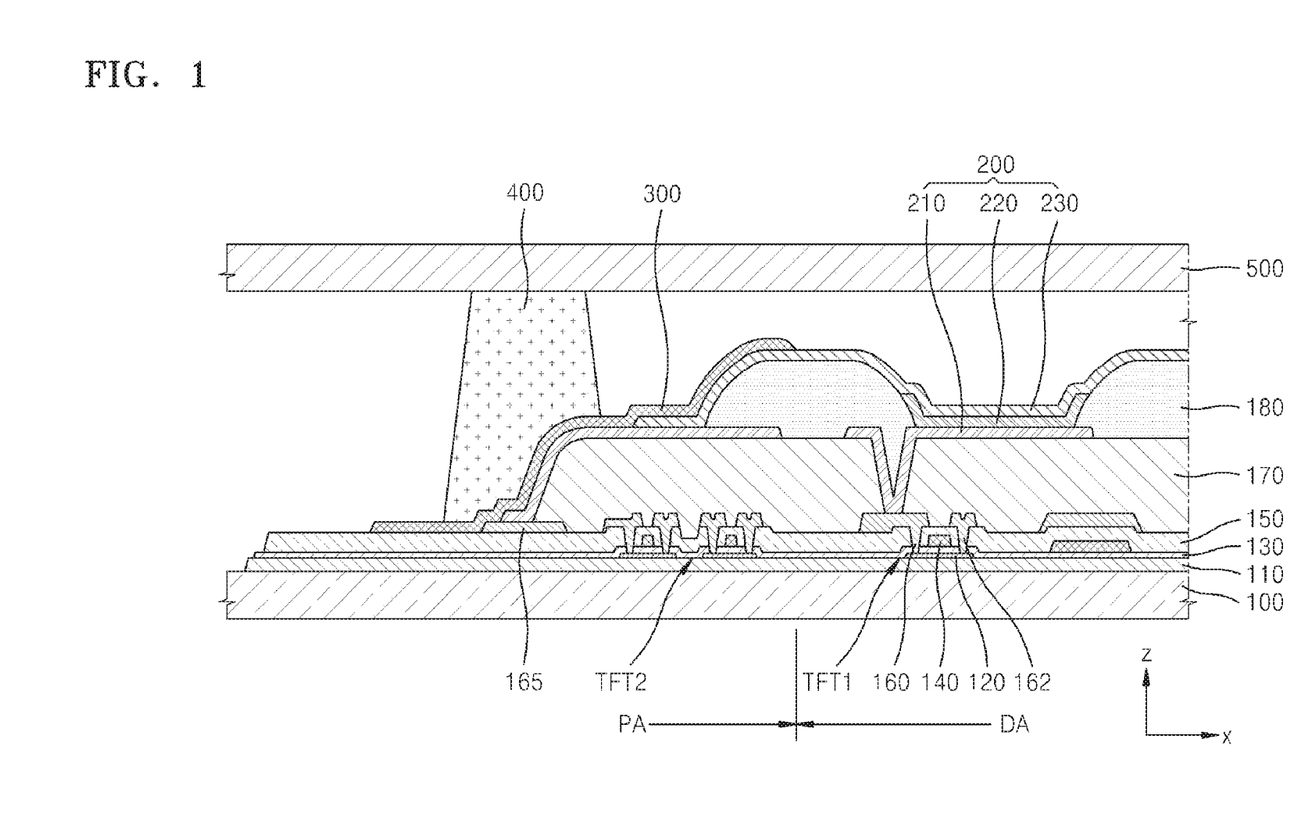
FIG. 1 is a cross-sectional view schematically illustrating an organic light-emitting display apparatus according to exemplary embodiments of the present invention.

FIG. 1 is a cross-sectional view schematically illustrating an organic light-emitting display apparatus according to exemplary embodiments of the present invention.

Referring to FIG. 1, the organic light-emitting display apparatus according to exemplary embodiments of the present invention includes a lower substrate 100, first thin film transistors (TFTs) TFT1 and second TFTs TFT2 disposed on the lower substrate 100, a first insulating layer 170, a barrier layer 300, a sealant 400, and an upper substrate 500.

The lower substrate 100 includes a display area DA and a peripheral area PA surrounding the display area DA. Organic light-emitting diodes (OLEDs) 200 are disposed in the display area DA, and a dead space forms a non-display area in the peripheral area PA. A driving unit that applies electric signals to the display area DA may be located in the peripheral area PA. The lower substrate 100 may be formed of various materials, e.g., a glass material, a metal material, or a plastic material, such as polyethylene terephthalate (PET), polyethylene naphthalate (PEN), or polyimide. The upper substrate 500 may be formed of the same or different materials as the lower substrate 100.

The first TFTs TFT1 are disposed in the display area DA of the lower substrate 100. The OLEDs 200 are electrically connected to the first TFTs TFT1 and may be disposed in the display area DA. A plurality of pixel electrodes 210 may be connected to the plurality of first TFTs TFT1.

The second TFTs TFT2 may be disposed in the peripheral area PA of the lower substrate 100. The second TFTs TFT2 may be, for example, included in a driving unit for controlling electric signals applied in the display area DA.

Each of the first TFTs TFT1 and the second TFTs TFT2 includes a semiconductor layer 120 that includes amorphous silicon, polycrystalline silicon, or an organic semiconductor material; a gate electrode 140; a source electrode 162; and a drain electrode 160. A buffer layer 110, formed of silicon oxide or silicon nitride, may be disposed on the lower substrate 100, so as to planarize a surface of the lower substrate 100 or to prevent impurities from penetrating into the semiconductor layer 120. The semiconductor layer 120 may be disposed on the buffer layer 110.

The gate electrode 140 is disposed on the semiconductor layer 120, and the source and drain electrodes 162 and 160 electrically communicate with one another via a signal applied to the gate electrode 140. In consideration of adhesion of gate electrode 140 to an adjacent layer, flatness of a surface on which the gate electrode 140 is to be stacked, and the processability of the gate electrode 140, the gate electrode 140 may be formed as a single layer or a multilayer. The gate electrode 140 may be formed of at least one of, for example, aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). In order to insulate the semiconductor layer 120 and the gate electrode 140 from each other, a gate insulating layer 130 formed of silicon oxide and/or silicon nitride may be disposed between the semiconductor layer 120 and the gate electrode 140.

An interlayer insulating layer 150 may be disposed on the gate electrode 140, and may be formed as a single layer or a multilayer formed of silicon oxide and/or silicon nitride.

The source and drain electrodes 162 and 160 are disposed on the interlayer insulating layer 150. The source and drain electrodes 162 and 160 are electrically connected to the semiconductor layer 120 via contact holes formed in the interlayer insulating layer 150 and the gate insulating layer 130. Regarding the conductivity of the source and drain electrodes 162 and 160, the source and drain electrodes 162 and 160 may each be formed as a single layer or a multilayer. Each of the source and drain electrodes 162 and 160 may be formed of at least one of, for example, Al, Pt, Pd, Ag, Mg, Au, Ni, Nd, Ir, Cr, Li, Ca, Mo, Ti, W, and Cu.

If necessary, on the first TFTs TFT1 and/or the second TFTs TFT2 having the above-described structures, a protecting layer (not shown) may be disposed to cover the first TFTs TFT1 and/or the second TFTs TFT2. The protecting layer may be formed of an inorganic material, such as silicon oxide, silicon nitride, or silicon oxynitride.

The first insulating layer 170 may be disposed on the protecting layer. In this case, the first insulating layer 170 may be a planarizing layer or a protecting layer. For example, when the OLEDs 200 are disposed on the first TFTs TFT1 as shown in FIG. 1, the first insulating layer 170 may be a planarizing layer for planarizing an upper surface of the first TFTs TFT1. The first insulating layer 170 may be formed of, for example, an acryl-based organic material or benzocyclobutene (BCB). Although FIG. 1 illustrates that the first insulating layer 170 is a single layer, the first insulating layer 170 may be a multilayer or have other various structures.

In the display area DA of the lower substrate 100, the OLEDs 200 are disposed on the first insulating layer 170. The OLEDs 200 include the pixel electrodes 210, an opposite electrode 230 that faces one of the pixel electrodes 210, and an intermediate layer 220 that includes an emission layer and is disposed between the pixel electrodes 210 and the opposite electrode 230.

The first insulating layer 170 includes an opening that exposes at least one of the source and drain electrodes 162 and 160 of the first TFTs TFT1. The pixel electrodes 210, which are electrically connected to the first TFTs TFT1 by contacting any one of the source and drain electrodes 162 and 160 via the opening, are disposed on the first insulating layer 170. The plurality of pixel electrodes 210 may be formed as transparent electrodes, semi-transparent electrodes, or reflective electrodes. When formed as transparent or semi-transparent electrodes, the pixel electrodes 210 may be formed of, for example, at least one of ITO, IZO, ZnO, $In_2O_3$, IGO, and AZO. When formed as reflective electrodes, the pixel electrodes 210 may include a reflective layer formed of at least one of Ag, Mg, Al, Pt, Pd, Au, Ni, Nd, Ir, and Cr, and a layer formed of at least one of ITO, IZO, ZnO, $In_2O_3$, IGO, and AZO. However, aspects of the present invention are not limited thereto, and materials and structures of the plurality of pixel electrodes 210 may be modified in various ways.

A second insulating layer 180 may be disposed on the first insulating layer 170. The second insulating layer 180 is a pixel defining layer that defines pixels via openings that correspond to each sub-pixel, i.e., openings that cover edges of each of the pixel electrodes 210 and expose at least a central portion of the pixel electrodes 210. Also, as illustrated in FIG. 1, the second insulating layer 180 increases a distance between end portions of the pixel electrodes 210 and the opposite electrode 230 disposed on the pixel electrodes 210, so that arcs are not formed at the end portions of the pixel electrodes 210. The second insulating layer 180 may be formed of an organic material, such as polyimide.

As described above, the second insulating layer 180, which may be a pixel defining layer, may define pixel areas and be disposed in the display area DA of the lower substrate 100. As illustrated in FIG. 1, the second insulating layer 180 may extend to the peripheral area PA surrounding the display area DA of the lower substrate 100. Details of the second insulating layer 180 will be described below.

The intermediate layer 220 of the OLEDs 200 may include a low molecular weight or polymer material. When the intermediate layer 220 includes a low molecular weight material, the intermediate layer 220 may also include an emission layer (EML), and may further include layers, for example, a hole injection layer (HIL), a hole transport layer (HTL), an electron transport layer (ETL), and an electron injection layer (EIL). The HIL and HTL may be disposed or stacked on one side of the EML while the ETL and the EIL are disposed on the other side of the EML. Also, various materials, such as copper phthalocyanine (CuPc), N,N'-Di (naphthalene-1-yl)-N,N'-diphenyl-benzidine (NPB), and (tris-8-hydroxyquinoline aluminum) ($Alq_3$) may be used as an organic material in the OLEDs 200. The above-described layers may be formed by using various methods, for example, a vacuum deposition method.

When the intermediate layer 220 includes a polymer material, an HIL and an EML may also be included in the intermediate layer 220. Poly(3,4-ethylenedioxythiophene) (PEDOT) may be used for the HIL, and a poly-phenylenevinylene (PPV)-based and polyfluorene-based polymer material may be used for the EML. The HIL and the EML may be formed by using various methods, such as a screen printing method, an inkjet printing method, or a laser induced thermal imaging (LITI) method. However, forming of the intermediate layer 220 not limited to these methods and may be formed in various ways.

The opposite electrode 230 is disposed over an entire upper surface or portions of the entire upper surface of the display area DA and the peripheral area PA. As illustrated in FIG. 1, the opposite electrode 230 may be disposed to cover at least a portion of the display area DA and the peripheral area PA. That is, the opposite electrode 230 may be integrally formed in the OLEDs 200 to correspond to the plurality of pixel electrodes 210.

The opposite electrode 230 may be a transparent electrode, semi-transparent electrode, or a reflective electrode. When the opposite electrode 230 is a transparent electrode or semi-transparent electrode, the opposite electrode 230 may include a layer formed of a metal having a low work function, e.g., at least one of Li, Ca, LiF/Ca, LiF/Al, Al, Ag, and Mg, and a transparent or semi-transparent conductive layer formed of at least one of ITO, IZO, ZnO, and $In_2O_3$. When the opposite electrode 230 is a reflective electrode, the opposite electrode 230 may include a layer formed of at least one of Li, Ca, LiF/Ca, LiF/Al, Al, Ag, and Mg. However, a structure and a material of the opposite electrode 230 are not limited thereto and may be modified in various ways.

The sealant 400 may be disposed in the peripheral area PA of the lower substrate 100. The upper substrate 500 may be attached to the lower substrate 100 by the sealant 400 and may seal the substrate 100. The sealant 400 may be formed of frit or epoxy, but is not limited thereto.

As illustrated in FIG. 1, the sealant 400 may be disposed such that at least a portion thereof overlaps the first insulating layer 170. When at least a portion of the sealant 400 overlaps the first insulating layer 170, the sealant 400 is disposed in a direction (+x direction) that is opposite to a direction (−x direction) of an edge of the lower substrate 100, i.e., near the display area DA. In other words, the sealant 400 extends in the +x direction toward the display area DA from an edge of the first insulating layer 170 and extends in the −x direction toward the peripheral area PA from the edge of the first insulating layer 170. When the sealant 400 is disposed near the display area DA, a width of the peripheral area PA of the lower substrate 100 in which the sealant 400 is disposed is reduced. Therefore, a dead space in the organic light-emitting display apparatus according to exemplary embodiments of the present invention may be reduced.

In order to form or dispose the sealant 400 near the display area DA, the sealant 400 may be disposed such that the at least a portion of the sealant 400 overlaps an edge portion of the first insulating layer 170. In this case, during a process of attaching the upper and lower substrates 500 and 100 with the sealant 400, the first insulating layer 170 and the second TFTs TFT2 disposed under the first insulating layer 170 in the peripheral area PA of the lower substrate 100 may be damaged by heat applied to the sealant 400. In order to decrease the potential for damage, the barrier layer 300 may be disposed between the first insulating layer 170 and the sealant 400 in the peripheral area PA of the lower substrate 100.

As illustrated in FIG. 1, the barrier layer 300 may be disposed on the first insulating layer 170 that is covering at least a portion of the second TFTs TFT2 in the peripheral area PA of the lower substrate 100. The barrier layer 300 may be disposed in various ways; for example, the barrier layer 300 may be disposed in the direction (−x direction) of the edge of the lower substrate 100 and extending in the direction (+x direction) opposite to the direction of the edge of the lower substrate 100. In other words, the barrier layer 300 extends in the +x direction toward the display area DA from an edge of the first insulating layer 170 and extends in the −x direction toward the peripheral area PA from the edge of the first insulating layer 170. However, even in this case, the barrier layer 300 is disposed between the sealant 400 and a portion of the first insulating layer 170 where the sealant 400 overlaps the first insulating layer 170 in the peripheral area PA of the lower substrate 100.

The barrier layer 300 may include an inorganic insulating material. For example, the barrier layer 300 may be formed of, but is not limited to, a silicon nitride and/or a silicon oxide.

A wiring 165 may be disposed on the interlayer insulating layer 150. The wiring 165 may be disposed in the peripheral area PA of the lower substrate 100, and the wiring 165 may be electrically connected to the opposite electrode 230 of the OLEDs 200. Although FIG. 1 illustrates that the wiring 165 is disposed on the interlayer insulating layer 150, the wiring 165 may be disposed on the same layer as any one of electrodes included in the first and second TFTs TFT1 and TFT2. For example, the wiring 165 may be disposed on the same layer as the source and drain electrodes 162 and 160 among the electrodes included in the first and second TFTs TFT1 and TFT2. In this case, the wiring 165 and the source and drain electrodes 162 and 160 may be formed of the same material.

Since the sealant 400 is disposed near the display area DA, heat generated during a process of sealing the upper and lower substrates 500 and 100 with the sealant 400 may damage elements disposed in the peripheral area PA of the lower substrate 100. However, the damage may be prevented or decreased by the barrier layer 300 disposed between the sealant 400 and the first insulating layer 170, and thus, the dead space of the organic light-emitting display apparatus may be significantly reduced by forming or disposing the sealant 400 closer to the display area DA.

Figure 2:
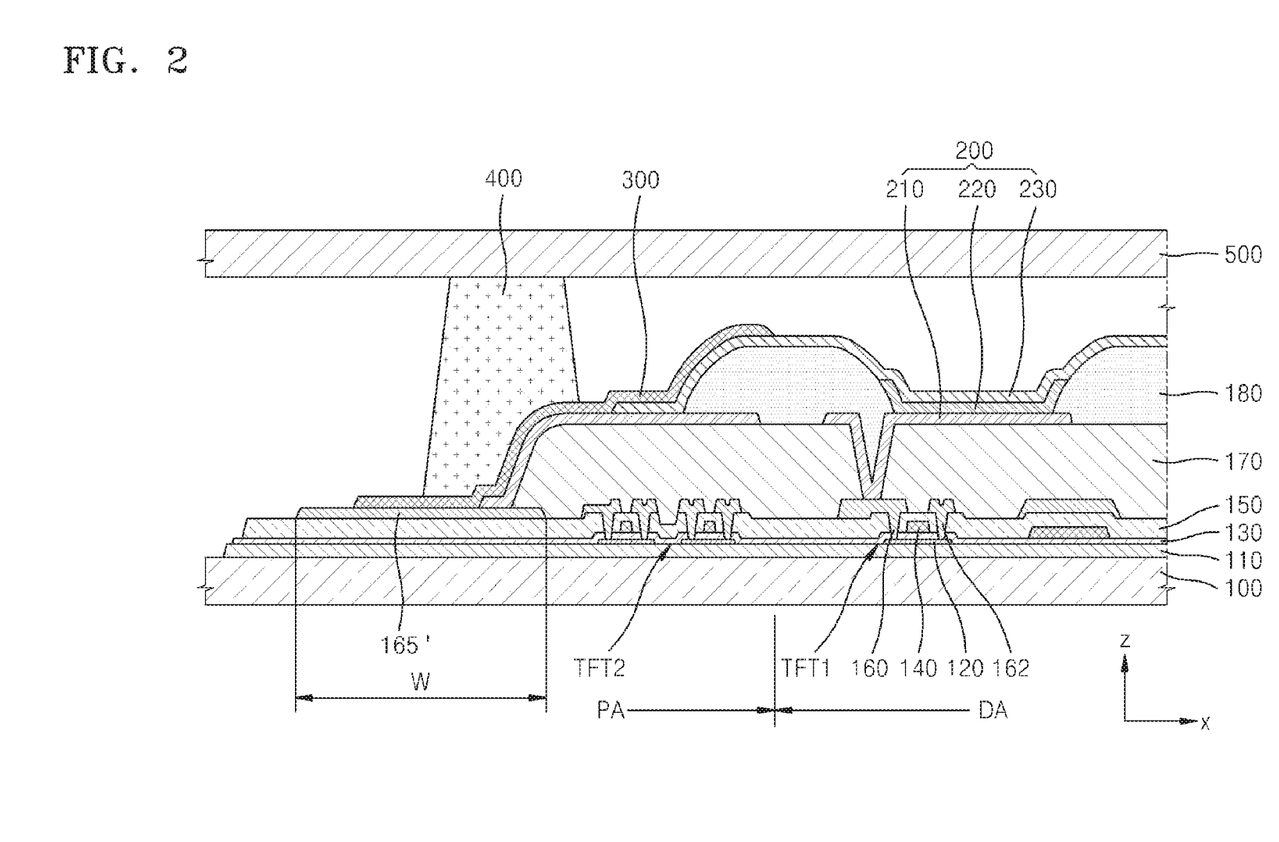
FIG. 2 is a cross-sectional view schematically illustrating an organic light-emitting display apparatus according to exemplary embodiments of the present invention.

FIG. 2 is a cross-sectional view schematically illustrating an organic light-emitting display apparatus according to exemplary embodiments of the present invention.

Referring to FIG. 2, an organic light-emitting display apparatus includes the lower substrate 100, the plurality of first TFTs TFT1 and the plurality of second TFTs TFT2 disposed on the lower substrate 100, a wiring 165', the first insulating layer 170, the barrier layer 300, the sealant 400, and the upper substrate 500. Elements and features of the organic light-emitting display apparatus of FIG. 2 that are substantially the same as those of the organic light-emitting display apparatus of FIG. 1 will not be repeatedly described.

The sealant 400 may be disposed in a peripheral area PA of the lower substrate 100 of the organic light-emitting display apparatus. The upper substrate 500 may be attached to the lower substrate 100 by using the sealant 400, and the sealant 400 may seal the upper substrate 500 and the lower substrate 100. The sealant 400 may be formed of frit or epoxy, but is not limited thereto.

As illustrated in FIG. 2, the sealant 400 may be disposed such that at least a portion thereof overlaps the first insulating layer 170. When at least a portion of the sealant 400 overlaps the first insulating layer 170, the sealant 400 is disposed in the direction (+x direction) that is opposite to the direction (-x direction) of an edge of the lower substrate 100, i.e., near a display area DA. In other words, the sealant 400 extends in the +x direction toward the display area DA from an edge of the first insulating layer 170 and extends in the -x direction toward the peripheral area PA from the edge of the first insulating layer 170. When the sealant 400 is disposed near the display area DA, a width of the peripheral area PA of the lower substrate 100 in which the sealant 400 is disposed may be reduced. Therefore, a dead space in the organic light-emitting display apparatus may be reduced.

In order to dispose the sealant 400 near the display area DA, the sealant 400 may be disposed such that the at least a portion thereof overlaps the first insulating layer 170. In this case, during a process of attaching the upper and lower substrates 500 and 100 by using the sealant 400, the first insulating layer 170 and the second TFTs TFT2 disposed under the first insulating layer 170 in the peripheral area PA of the lower substrate 100 may be damaged due to heat applied to the sealant 400. In order to decrease the potential for damage, the barrier layer 300 may be disposed between the first insulating layer 170 and the sealant 400 in the peripheral area PA of the lower substrate 100.

As illustrated in FIG. 2, the barrier layer 300 may be disposed on the first insulating layer 170 that covers the second TFTs TFT2 in the peripheral area PA of the lower substrate 100. The barrier layer 300 may be disposed in various ways, for example, may be disposed in the direction (-x direction) of the edge of the lower substrate 100 and extend in the direction (+x direction) opposite to the direction of the edge of the lower substrate 100. In other words, the barrier layer 300 extends in the +x direction toward the display area DA from an edge of the first insulating layer 170 and extends in the -x direction toward the peripheral area PA from the edge of the first insulating layer 170. However, even in this case, the barrier layer 300 is disposed between the sealant 400 and a portion of the first insulating layer 170 where the sealant 400 overlaps the first insulating layer 170 in the peripheral area PA of the lower substrate 100.

The barrier layer 300 may include an inorganic insulating material. For example, the barrier layer 300 may be formed of, but is not limited to, a silicon nitride and/or a silicon oxide.

The organic light-emitting display apparatus may include the wiring 165' that extends in a direction of the edge of the lower substrate 100. The wiring 165' may be disposed in the peripheral area PA of the lower substrate 100, and the wiring 165' may be electrically connected to the opposite electrode 230 of the OLEDs 200.

Although FIG. 2 illustrates that the wiring 165' is disposed on the interlayer insulating layer 150, the wiring 165' may be disposed on the same layer as any one of electrodes included in the first and second TFTs TFT1 and TFT2. For example, the wiring 165' may be disposed on the same layer as the source and drain electrodes 162 and 160 among the electrodes included in the first and second TFTs TFT1 and TFT2. In this case, the wiring 165' and the source and drain electrodes 162 and 160 may be formed of the same material. Therefore, the wiring 165' may be a single layer or multi-layer formed of at least one of, for example, Al, Pt, Pd, Ag, Mg, Au, Ni, Nd, Ir, Cr, Li, Ca, Mo, Ti, W, and Cu.

Since the wiring 165' extends in the direction of the edge of the lower substrate 100, a width W of the wiring 165' that includes metal increases. At least a portion of an extending end of the wiring 165' may not overlap the sealant 400. For example, the wiring 165' may be disposed or formed to have a width in the x direction that extends from under the first insulating layer 170 and the sealant 400 to beyond an edge of the sealant 400 closest to an edge of the organic light-emitting display apparatus in the x direction. Accordingly, heat, which is transmitted via the sealant 400 to the first insulating layer 170 or the second TFTs TFT2 disposed under the first insulating layer 170 during a process of attaching the lower and upper substrates 100 and 500 by using the sealant 400, may be easily emitted to the outside via the extending end of the wiring 165', e.g., emitted to the outside by the edge of the wiring 165' that extends beyond the edge of the sealant 400 closest to the edge of the organic light-emitting display apparatus in the x direction.

As described above, the barrier layer 300 may be provided between the sealant 400 and the first insulating layer 170. Since the wiring 165' extends in the direction of the edge of the lower substrate 100, the barrier layer 300 may expose at least a portion of the extending end of the wiring 165'. Accordingly, heat, which is transmitted via the sealant 400, may be easily emitted to the outside via the extending end of the wiring 165' that is exposed since the barrier layer 300 is not disposed thereon.

Figure 3:
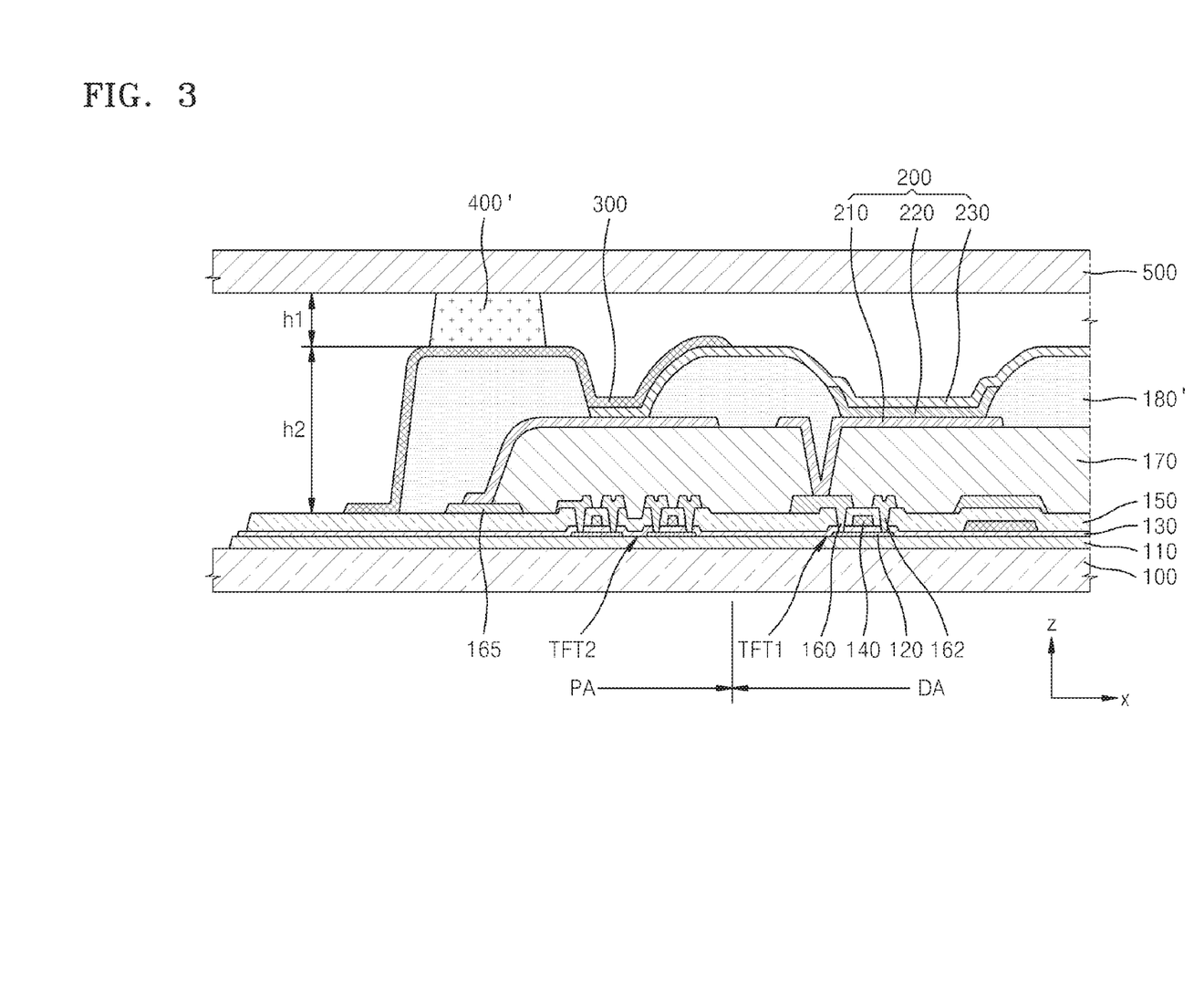
FIG. 3 is a cross-sectional view schematically illustrating an organic light-emitting display apparatus according to exemplary embodiments of the present invention.

FIG. 3 is a cross-sectional view schematically illustrating an organic light-emitting display apparatus according to exemplary embodiments of the present invention.

Referring to FIG. 3, the organic light-emitting display apparatus includes the lower substrate 100, the plurality of first TFTs TFT1 and the plurality of second TFTs TFT2 disposed on the lower substrate 100, the first insulating layer 170, a second insulating layer 180', the barrier layer 300, a sealant 400', and the upper substrate 500. Elements and features of the organic light-emitting display apparatus of FIG. 3 that are the same as those of the organic light-emitting display apparatus of FIG. 1 will not be repeatedly described.

In the organic light-emitting display apparatus, the first TFTs TFT1 may be disposed in a display area DA of the lower substrate 100, and the second TFTs TFT2 may be disposed in a peripheral area PA of the lower substrate 100.

The first insulating layer 170 may be disposed to cover the first and second TFTs TFT1 and TFT2. In this case, the first insulating layer 170 may be a planarizing layer or a protecting layer. The first insulating layer 170 may be formed of, for example, an acryl-based organic material or benzocyclobutene (BCB). Although FIG. 3 illustrates that the first insulating layer 170 is a single layer, the first insulating layer 170 may be a multilayer or modified in various ways.

The OLEDs 200 are disposed on the first insulating layer 170 in the display area DA of the lower substrate 100. The OLEDs 200 include the pixel electrodes 210, the opposite electrode 230 that faces the pixel electrodes 210, and the intermediate layer 220 that includes the EML and is disposed between the pixel electrodes 210 and the opposite electrode 230.

The first insulating layer 170 includes an opening that exposes at least one of the source and drain electrodes 162 and 160 of the first TFTs TFT1. The pixel electrodes 210, which are electrically connected to the first TFTs TFT1 by contacting one of the source and drain electrodes 162 and 160 via the opening, are disposed on the first insulating layer 170.

The second insulating layer 180' may be disposed on the first insulating layer 170. As described above, the second insulating layer 180' disposed on the first insulating layer 170 in the display area DA of the lower substrate 100 may be a pixel defining layer that defines pixels via openings that corresponds to each sub-pixel, i.e., openings that cover an edge of each of the pixel electrodes 210 and expose at least a central portion of the pixel electrodes 210. The second insulating layer 180' may be formed of, but is not limited to, an organic material, such as polyimide.

The second insulating layer 180' may extend on the first insulating layer 170 in the peripheral area PA of the lower substrate 100. Although FIG. 3 illustrates that the second insulating layer 180' covers an end of the first insulating layer 170 in the peripheral area PA of the lower substrate 100, the second insulating layer 180' is not limited thereto.

The sealant 400' may be disposed in the peripheral area PA of the lower substrate 100. The upper substrate 500 may be attached to the lower substrate 100 by using the sealant 400', and the sealant 400' may seal the upper substrate 500 and the lower substrate 100. The sealant 400' may be formed of frit or epoxy, but is not limited thereto.

As illustrated in FIG. 3, the sealant 400' may be disposed such that at least a portion thereof overlaps the first insulating layer 170. When at least a portion of the sealant 400' overlaps the first insulating layer 170, the sealant 400' is disposed in a direction (+x direction) that is opposite to a direction (−x direction) of an edge of the lower substrate 100, i.e., near the display area DA. In other words, the sealant 400' extends in the +x direction toward the display area DA from an edge of the first insulating layer 170 and extends in the −x direction toward the peripheral area PA from the edge of the first insulating layer 170. When the sealant 400' is disposed near the display area DA, a width of the peripheral area PA of the lower substrate 100 in which the sealant 400' is disposed is reduced. Therefore, a dead space in the organic light-emitting display apparatus according to another embodiment of the present invention may be reduced.

In order to dispose the sealant 400 near the display area DA, the sealant 400' may be disposed such that the at least a portion thereof overlaps the first insulating layer 170. In this case, during a process of attaching the upper and lower substrates 500 and 100 by using the sealant 400', the first insulating layer 170 and the second TFTs TFT2 disposed under the first insulating layer 170 in the peripheral area PA of the lower substrate 100 may be damaged by heat applied to the sealant 400'. In order to decrease the potential for damage, the second insulating layer 180' may extend on the first insulating layer 170 disposed in the peripheral area PA of the lower substrate 100, and then, the sealant 400' may be disposed on the second insulating layer 180.

Accordingly, the sealant 400' may be disposed on a portion of the second insulating layer 180' that is disposed in the peripheral area PA of the lower substrate 100, as illustrated in FIG. 3. Since the sealant 400' is disposed on the second insulating layer 180', a height h1 of the sealant 400' may be reduced. In other words, in the related art, a sealant is disposed between the lower and upper substrates 100 and 500, and thus, the sealant is disposed such that a height thereof corresponds to the entire distance between the lower and upper substrates 100 and 500. However, in the organic light-emitting display apparatus according to exemplary embodiments of the present invention, since the sealant 400' is disposed on the second insulating layer 180', which is disposed or formed on the first insulating layer 170, the height h1 of the sealant 400' is reduced by a height h2 of the first and second insulating layers 170 and 180'. Therefore, as the height h1 of the sealant 400' is reduced, an amount of heat that is generated via the sealant 400' during a process of attaching the upper and lower substrates 500 and 100 to each other is also reduced.

Also, the barrier layer 300 may be disposed between the second insulating layer 180' and the sealant 400' in the peripheral area PA of the lower substrate 100. As illustrated in FIG. 3, the barrier layer 300 may be disposed on the second insulating layer 180' placed on the first insulating layer 170 that covers the second TFTs TFT2. The barrier layer 300 may be disposed in various ways, for example, disposed in the direction (−x direction) of the edge of the lower substrate 100 and extend in the direction (+x direction) opposite to the direction of the edge of the lower substrate 100. In other words, the barrier layer 300 extends in the +x direction toward the display area DA from an edge of the first insulating layer 170 and extends in the −x direction toward the peripheral area PA from the edge of the first insulating layer 170. The barrier layer 300 may include an inorganic insulating material. For example, the barrier layer 300 may be formed of, but is not limited to, a silicon nitride and/or a silicon oxide.

As describe above, the sealant 400' having a lower height reduces an amount of generated heat, and also, the barrier layer 300, which is disposed between the sealant 400' and the second insulating layer 180, blocks heat transmitted to elements disposed under the sealant 400'. Further, the wiring 165', which extends from below the first insulating layer 170 to beyond the edge of the sealant 400' closest to the edge of the organic light-emitting apparatus, may be included as well to further protect the organic light-emitting apparatus. Thus, not only the dead space in the organic light-emitting display apparatus may be reduced, but also, elements disposed in the peripheral area PA of the lower substrate 100 may be protected from being damaged by heat while sealing the lower substrate 100 with the upper substrate 500.

Although the organic light-emitting display apparatus has been mainly described, the exemplary embodiments of the present invention are not limited specifically thereto and, for example, the different exemplary embodiments may be combined.

Figure 4:
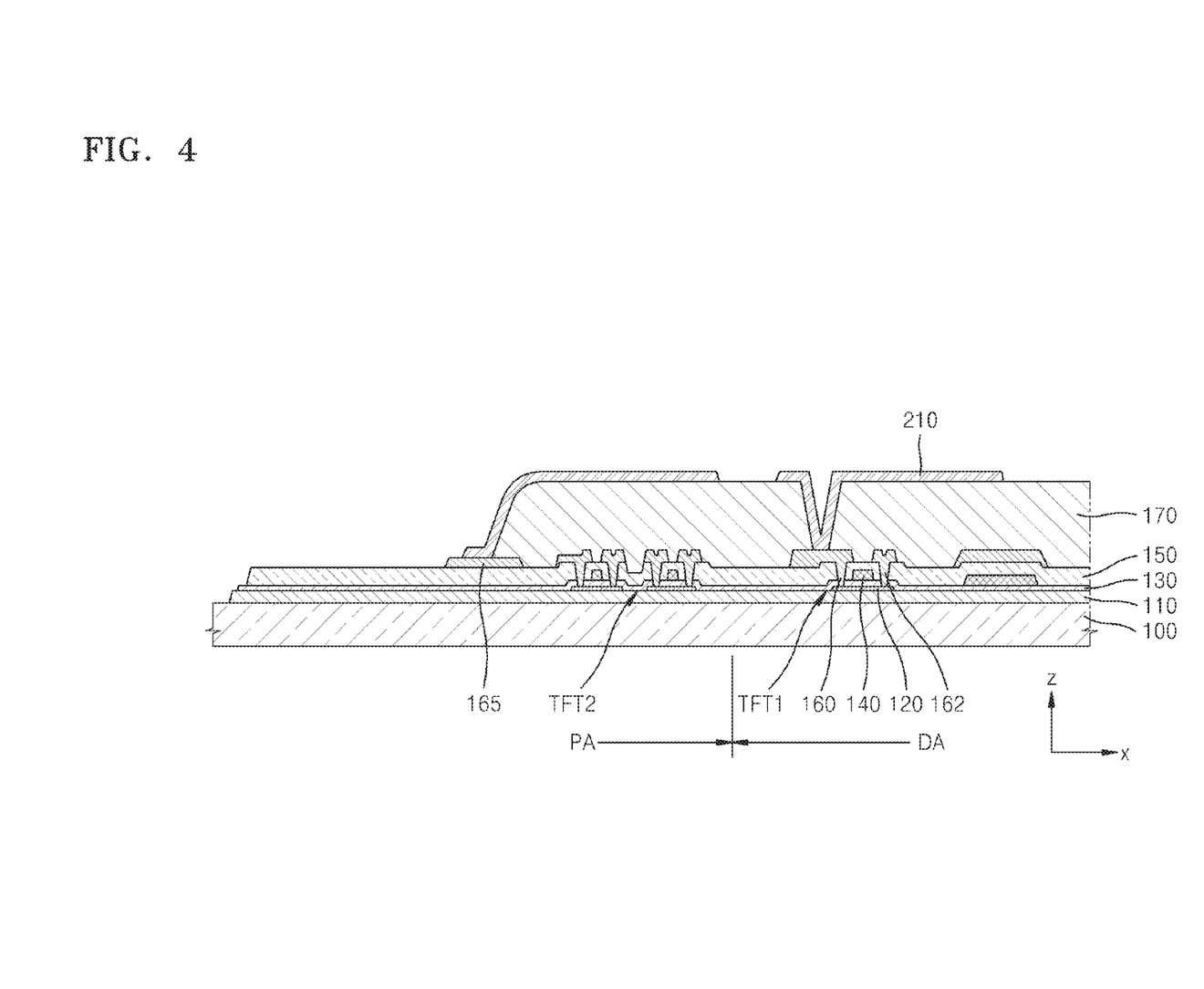
FIGS. 4, 5, and 6 are cross-sectional views schematically illustrating a method of manufacturing an organic light-emitting display apparatus according to exemplary embodiments of the present invention.
Figure 5:
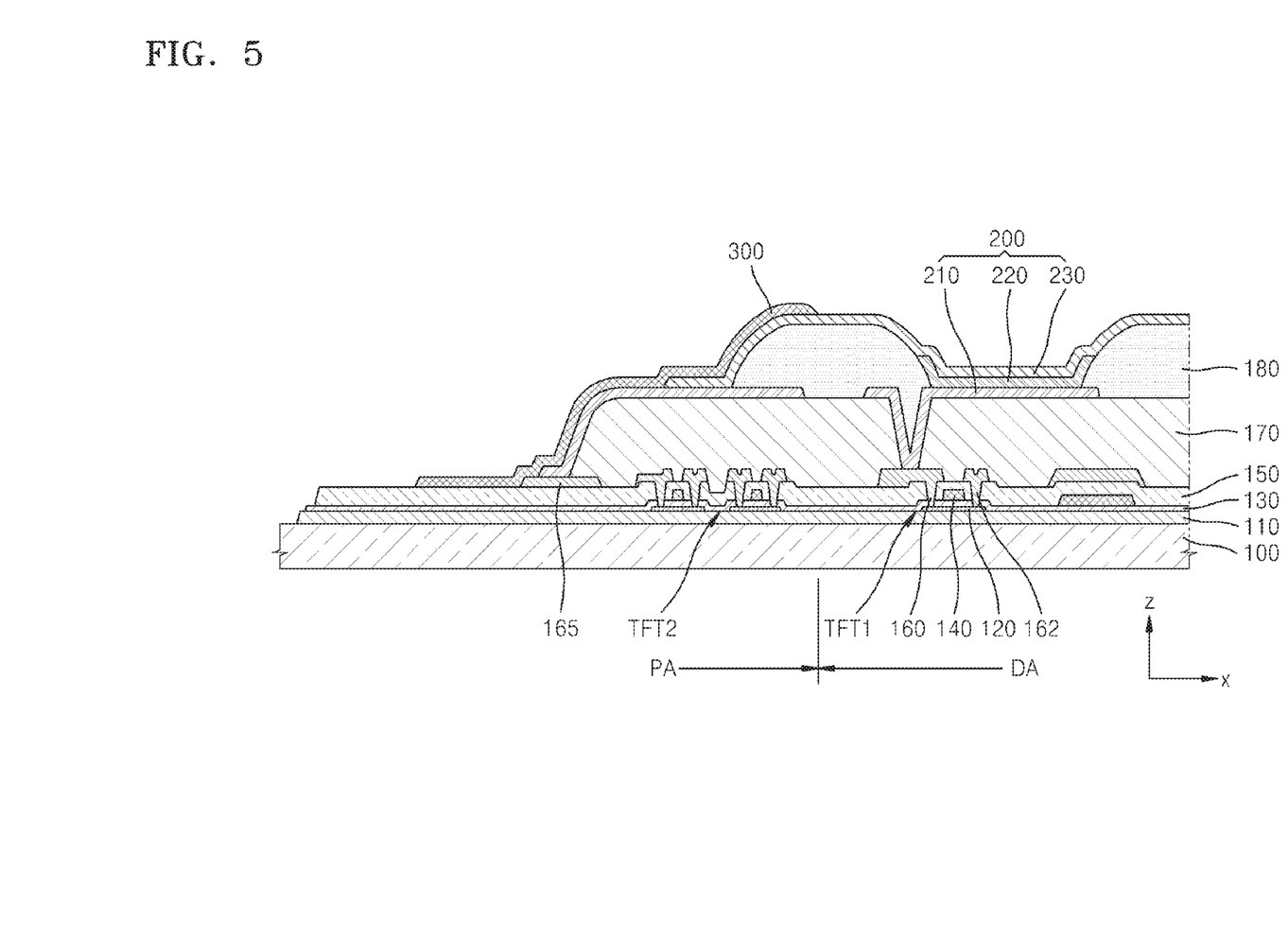
Figure 6:
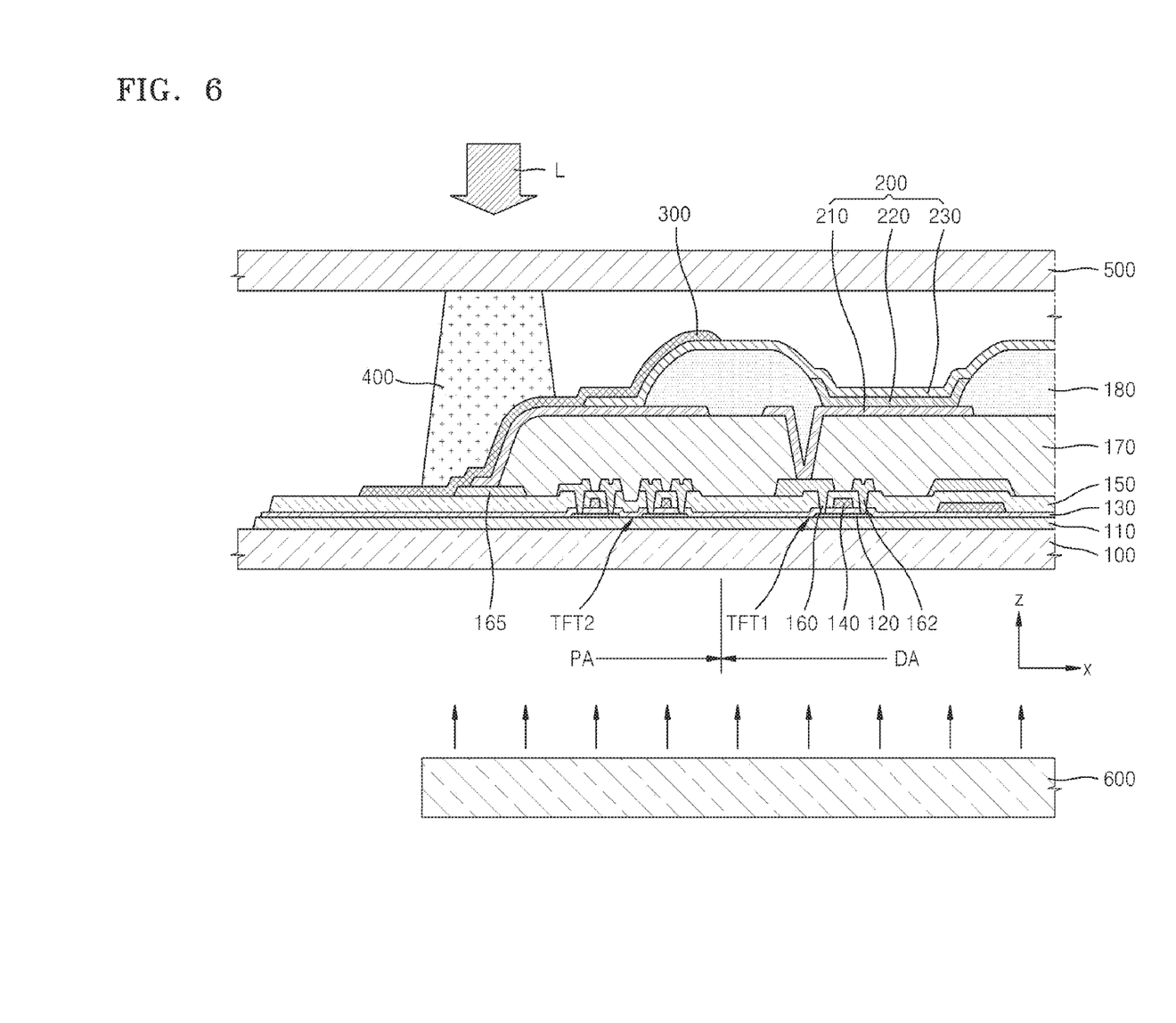

FIGS. 4, 5, and 6 are cross-sectional views schematically illustrating a method of manufacturing the organic light-emitting display apparatus according to exemplary embodiments of the present invention.

Referring to FIG. 4, the lower substrate 100 including the display area DA and the peripheral area PA surrounding the display area DA are prepared, the first TFTs TFT1 are formed in the display area DA, and the second TFTs TFT2 are formed in the peripheral area PA.

The first and second TFTs TFT1 and TFT2 may be formed by forming the buffer layer 110 on the lower substrate 100, and then patterning the semiconductor layer 120 on the buffer layer 110. After the semiconductor layer 120 is patterned, the gate insulating layer 130 is stacked on the semiconductor layer 120, and the gate electrode 140 is patterned on the gate insulating layer 130. The source and drain electrodes 162 and 160, which are electrically connected to the semiconductor layer 120, may be patterned on the gate insulating layer 130.

During a process of forming the first and second TFTs TFT1 and TFT2, the wiring 165 may be formed simultaneously on the same layer as a layer of any one of the electrodes included in the first and second TFTs TFT1 and TFT2. As illustrated in FIG. 4, the wiring 165 may be simultaneously formed on the same layer as the source and drain electrodes 162 and 160 of the first and second TFTs TFT1 and TFT2. However, the wiring 165 is not limited thereto, and forming thereof may be modified in various ways. Further, the wiring 165' may be formed in a similar manner.

After forming the first and second TFTs TFT1 and TFT2, a protecting layer (not shown) and the first insulating layer 170 are stacked on the first and second TFTs TFT1 and TFT2. The protecting layer protects the first and second TFTs TFT1 and TFT2, and the first insulating layer 170 may be a protecting layer to protect the first and second TFTs TFT1 and TFT2 or may be a planarizing layer to planarize an upper surface of the first and second TFTs TFT1 and TFT2.

A contact hole is formed in the first insulating layer 170 and the interlayer insulating layer 150, and then, the pixel electrodes 210 are formed to be electrically connected to one of the source and drain electrodes 162 and 160 of the first TFTs TFT1 via the contact hole. In this case, the pixel electrodes 210 may be formed on the first TFTs TFT1 in the display area DA.

Referring to FIG. 5, after the pixel electrodes 210 are formed on the first insulating layer 170, the second insulating layer 180 may be formed on the pixel electrodes 210. The second insulating layer 180 formed on the pixel electrodes 210 may be a pixel defining layer that defines a pixel unit. The second insulating layer 180 may be formed to cover edges of the plurality of pixel electrodes 210 such that a central portion of each of the plurality of pixel electrodes 210 is exposed. Further, the second insulating layer 180' may be formed in a similar manner.

After the second insulating layer 180 is formed on the first insulating layer 170, the intermediate layer 220 that includes the EML may be formed on the central portion of each of the plurality of pixel electrodes 210 that are exposed by the second insulating layer 180. Then, the opposite electrode 230 may be formed with respect to the plurality of pixel electrodes 210. For example, the opposite electrode 230 may be formed on an entire surface of the second insulating layer 180, as illustrated in FIG. 5, or at least on portions of the entire surface of the second insulating layer 180.

As illustrated in FIG. 5, after the opposite electrode 230 is formed, the barrier layer 300 may be formed on at least a portion of the first insulating layer 170 in the peripheral area PA of the lower substrate 100. The barrier layer 300 may be formed of an inorganic material, e.g., a silicon oxide and/or a silicon nitride. The barrier layer 300 may decrease potential for damage to elements of the organic light-emitting display apparatus by heat that is generated while sealing the lower substrate 100 and the upper substrate 500 with the sealant 400 and transmitted to the second TFTs TFT2 under the first insulating layer 170.

Referring to FIG. 6, the sealant 400 may be formed in the peripheral area PA of the lower substrate 100. The sealant 400 may be formed of frit or epoxy, but is not limited thereto. The sealant 400 may be directly formed on the lower substrate 100 such that at least a portion of the sealant 400 overlaps the first insulating layer 170 in the peripheral area PA of the lower substrate 100. The sealant 400 may be directly formed on the upper substrate 500 such that the lower substrate 100 is attached to the upper substrate 500.

As described above, the sealant 400 may be formed such that the least a portion thereof overlaps the first insulating layer 170. When at least a portion of the sealant 400 overlaps the first insulating layer 170, the sealant 400 is formed in a direction (+x direction) that is opposite to a direction (−x direction) of an edge of the lower substrate 100, i.e., near the display area DA. In other words, the sealant 400 extends in the +x direction toward the display area DA from an edge of the first insulating layer 170 and extends in the −x direction toward the peripheral area PA from the edge of the first insulating layer 170. When the sealant 400 is formed near the display area DA, a width of the peripheral area PA of the lower substrate 100 in which the sealant 400 is disposed may be reduced. Therefore, a dead space in the organic light-emitting display apparatus according to exemplary embodiments of the present invention may be reduced. Further, the sealant 400' may be formed in a similar manner.

After the sealant 400 is formed, the upper substrate 500 may be attached to seal the lower substrate 100 by using the sealant 400 and seal the lower substrate 100. In this case, as illustrated in FIG. 6, a laser L may be radiated on the sealant 400 from a direction of the upper substrate 500 to attach the upper and lower substrates 500 and 100 to each other. Elements, such as the first insulating layer 170 and the second TFTs TFT2 disposed under the first insulating layer 170 in the peripheral area PA of the lower substrate 100, may be damaged by heat applied to the sealant 400 while sealing the lower substrate 100 with the upper substrate 500. In order to decrease potential for damage, as described above, the barrier layer 300 may be disposed between the first insulating layer 170 and the sealant 400 such that the barrier layer 300 blocks heat from being transmitted to the elements disposed in the peripheral area PA of the lower substrate 100 and thus damaging these elements.

Also, in order to protect elements, such as the first insulating layer 170 and the second TFTs TFT2 from being damaged by heat applied to the sealant 400 while sealing the lower substrate 100 and the upper substrate 500, a temperature adjustment apparatus 600 may be used in the vicinity of the lower substrate 100.

The temperature adjustment apparatus 600 may adjust temperature, such that a temperature of the lower substrate 100 is lower than a temperature at which the materials and elements disposed on the lower substrate 100 are damaged. For example, since a glass transition temperature (Tg) of polyimide, which is one of the materials vulnerable to heat damage, is about 400° C., the temperature of the lower substrate 100 does not have to be decreased to room temperature, but has to be maintained at an appropriate level. Therefore, the organic light-emitting display apparatus may be manufactured under simple manufacturing conditions and with low costs, and thus, it is possible to realize an organic light-emitting display apparatus including a reduced dead space.

For example, as illustrated in FIG. 6, the temperature adjustment apparatus 600 may be provided under the lower substrate 100, and cold air may be emitted from the temperature adjustment apparatus 600 to the lower substrate 100, so as to prevent a temperature thereof from increasing up to a temperature that may damage the lower substrate 100 and thin films and elements disposed thereon.

As described above, according to the one or more of the above embodiments of the present invention, an organic light-emitting display apparatus including a reduced dead space and a method of manufacturing the organic light-emitting display apparatus are provided. However, the scope of the present invention is not limited to the above-described exemplary embodiments.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments of the present invention have been described with reference to the figures, it will be understood by those of ordinary skill in the art that various changes in form and details may be made therein without departing from the spirit and scope of the present invention as defined by the following claims.

What is claimed is:

1. A method of manufacturing an organic light-emitting display apparatus, the method comprising:
   preparing a lower substrate comprising a display area and a peripheral area surrounding the display area;
   forming first thin film transistors (TFTs) in the display area of the lower substrate
   forming a first insulating layer that is disposed in the display area and at least a portion of the peripheral area of the lower substrate and that covers the first TFTs;
   forming organic light-emitting diodes (OLEDs) to be electrically connected to the first TFTs;
   forming a barrier layer on at least a portion of the first insulating layer that is formed in the peripheral area of the lower substrate;
   forming a sealant on the barrier layer such that at least a portion of the sealant overlaps the first insulating layer; and
   sealing an upper substrate with the lower substrate,
   wherein the barrier layer is formed between the first insulating layer and the sealant, and is disposed only in the peripheral area.

2. The method of claim 1, further comprising forming second TFTs in the peripheral area of the lower substrate, wherein the barrier layer is formed on the first insulating layer to cover the second TFTs.

3. The method of claim 1, wherein the barrier layer is formed of an inorganic material.

4. The method of claim 3, wherein the lower substrate is sealed with the upper substrate by radiating a laser on the sealant from a direction of the upper substrate.

5. The method of claim 4, wherein the sealing comprises adjusting a temperature of the lower substrate by using a temperature adjustment apparatus near the lower substrate while the laser is radiated on the sealant.

6. The method of claim 5, wherein the temperature adjustment apparatus decreases the temperature of the lower substrate while the laser is radiated on the sealant.

7. The method of claim 1, further comprising forming a wiring in the peripheral area of the lower substrate and electrically connected to the OLEDs,
   wherein the wiring extends beyond an edge of the sealant closest to an edge of the lower substrate.

8. The method of claim 7, wherein the barrier layer does not extend to cover an edge of the wiring closest to the edge of the lower substrate.

9. A method of manufacturing an organic light-emitting display apparatus, the method comprising:
   preparing a lower substrate comprising a display area and a peripheral area surrounding the display area;
   forming first thin film transistors (TFTs) in the display area of the lower substrate;
   forming a first insulating layer that is disposed in the display area and comprises a peripheral edge in the peripheral area of the lower substrate and that covers the first TFTs and does not extend to an edge of the lower substrate;
   forming organic light-emitting diodes (OLEDs) to be electrically connected to the first TFTs;
   forming a barrier layer on at least a portion of the first insulating layer that is formed in the peripheral area of the lower substrate, wherein the barrier layer is disposed only in the peripheral area;
   forming a sealant on the barrier layer such that at least a portion of the sealant fully overlaps the outer peripheral edge of the first insulating layer; and
   sealing an upper substrate with the lower substrate by radiating a laser on the sealant from a direction of the upper substrate.

10. The method of claim 9, further comprising forming second TFTs in the peripheral area of the lower substrate, wherein the barrier layer is formed on the first insulating layer to cover the second TFTs.

11. The method of claim 9, wherein the barrier layer is formed of an inorganic material.

12. The method of claim 11, wherein the sealing comprises adjusting a temperature of the lower substrate by using a temperature adjustment apparatus near the lower substrate while the laser is radiated on the sealant.

13. The method of claim 12, wherein the temperature adjustment apparatus decreases the temperature of the lower substrate while the laser is radiated on the sealant.

14. The method of claim 9, further comprising forming a wiring in the peripheral area of the lower substrate and electrically connected to the OLEDs, wherein the wiring extends beyond an edge of the sealant closest to an edge of the lower substrate.

15. The method of claim 14, wherein the barrier layer does not extend to cover an edge of the wiring closest to the edge of the lower substrate.

* * * * *